United States Patent
Yang

(10) Patent No.: US 9,502,123 B2
(45) Date of Patent: Nov. 22, 2016

(54) ADAPTIVE BLOCK PARAMETERS

(71) Applicant: SanDisk Technologies, Inc., Plano, TX (US)

(72) Inventor: Niles Yang, Mountain View, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 14/692,564

(22) Filed: Apr. 21, 2015

(65) Prior Publication Data

US 2016/0314847 A1    Oct. 27, 2016

(51) Int. Cl.
| | |
|---|---|
| G11C 16/04 | (2006.01) |
| G11C 16/16 | (2006.01) |
| G11C 16/26 | (2006.01) |
| G06F 11/10 | (2006.01) |
| G11C 29/52 | (2006.01) |
| G11C 29/50 | (2006.01) |

(52) U.S. Cl.
CPC ........... *G11C 16/16* (2013.01); *G06F 11/1072* (2013.01); *G11C 16/26* (2013.01); *G11C 29/50004* (2013.01); *G11C 29/52* (2013.01); *G11C 2029/5004* (2013.01)

(58) Field of Classification Search
USPC ........................ 365/185.03, 185.11, 185.24
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,532,962 A | 7/1996 | Auclair et al. | |
| 5,570,315 A | 10/1996 | Tanaka et al. | |
| 5,595,924 A | 1/1997 | Yuan et al. | |
| 5,661,053 A | 8/1997 | Yuan | |
| 5,667,869 A * | 9/1997 | Beretta ................ | B29D 29/00 264/145 |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,538,922 B1 * | 3/2003 | Khalid ................ | G11C 11/56 365/185.03 |
| 6,862,218 B2 | 3/2005 | Guterman et al. | |
| 7,301,807 B2 | 11/2007 | Khalid et al. | |
| 7,397,697 B2 | 7/2008 | So et al. | |
| 7,954,037 B2 | 5/2011 | Lasser et al. | |
| 2011/0131473 A1 | 6/2011 | Mokhlesi et al. | |
| 2012/0268994 A1 | 10/2012 | Nagashima | |
| 2013/0003480 A1 | 1/2013 | D'Abreu et al. | |
| 2013/0055012 A1 | 2/2013 | Roh | |
| 2013/0073924 A1 | 3/2013 | D'Abreu et al. | |

OTHER PUBLICATIONS

Eitan et al., "NROM: A novel Localized Trapping, 2-Bit Nonvolatile Memory Cell," IEEE Electron Device Letters, vol. 21, No. 11, Nov. 2000, pp. 543-545.

* cited by examiner

*Primary Examiner* — Vu Le
(74) *Attorney, Agent, or Firm* — Davis Wright Tremaine LLP

(57) ABSTRACT

Data programmed in a block using a first set of programming parameters is read and a number of memory cells having threshold voltages in an intermediate threshold voltage range that is between ranges assigned to logic states is determined. The number is compared to a threshold number and if the number exceeds the threshold number then subsequent programming uses a second set of programming parameters.

21 Claims, 14 Drawing Sheets

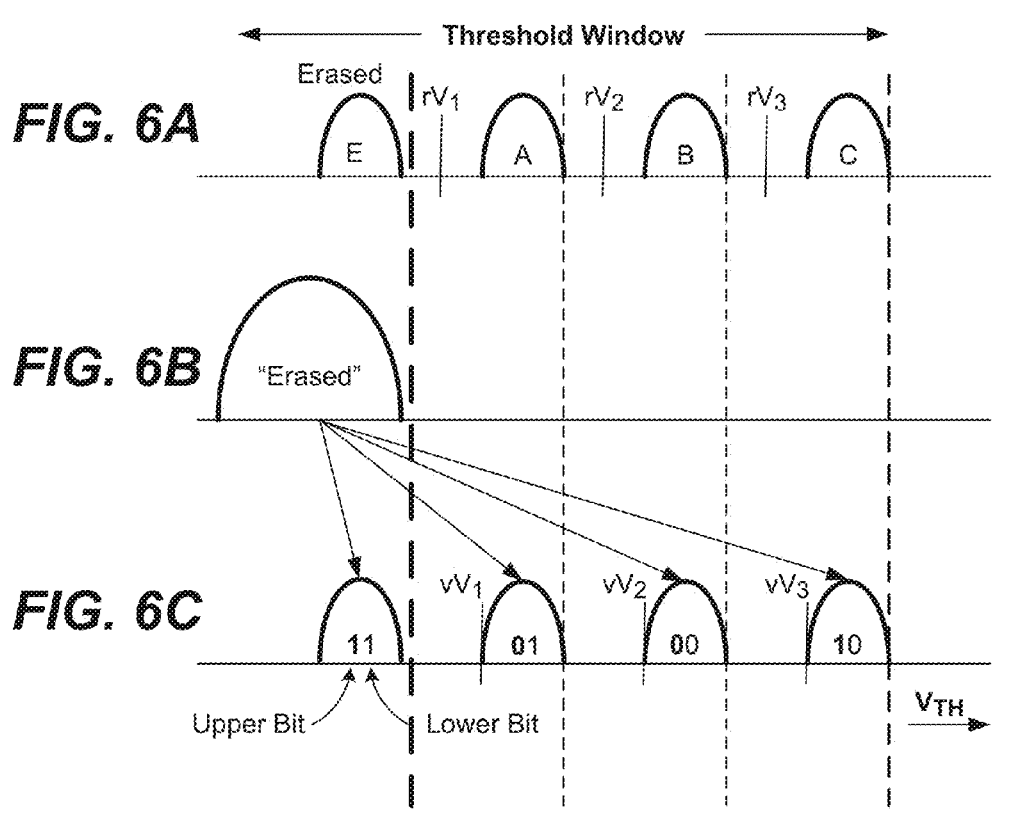
Programming into four states represented by a 2-bit code

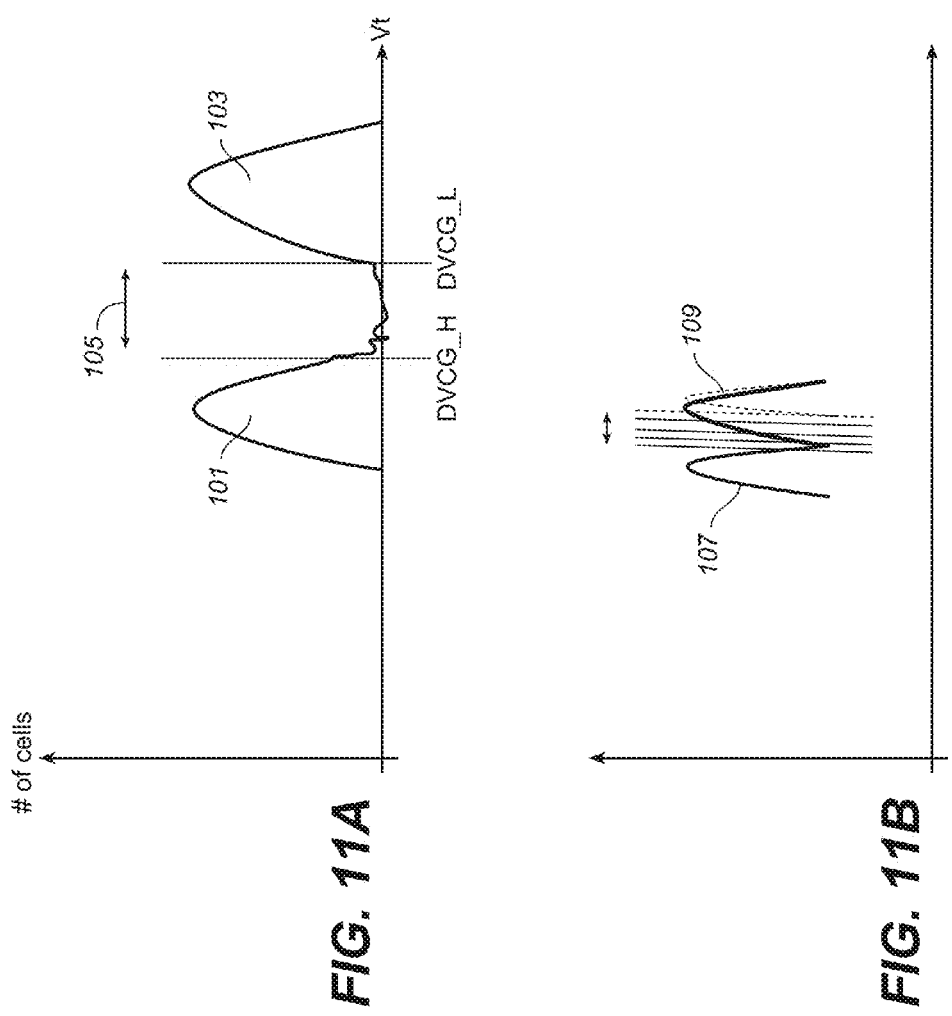

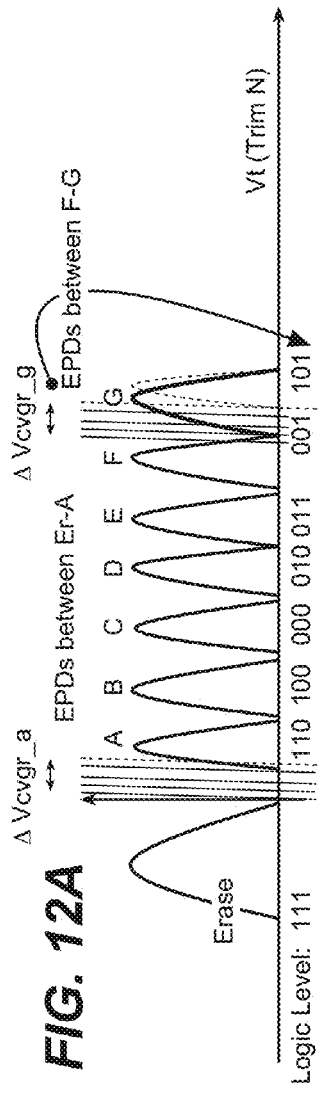
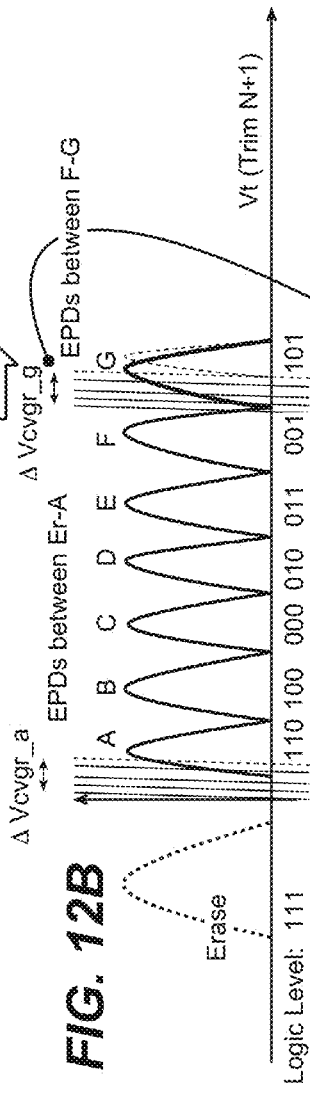
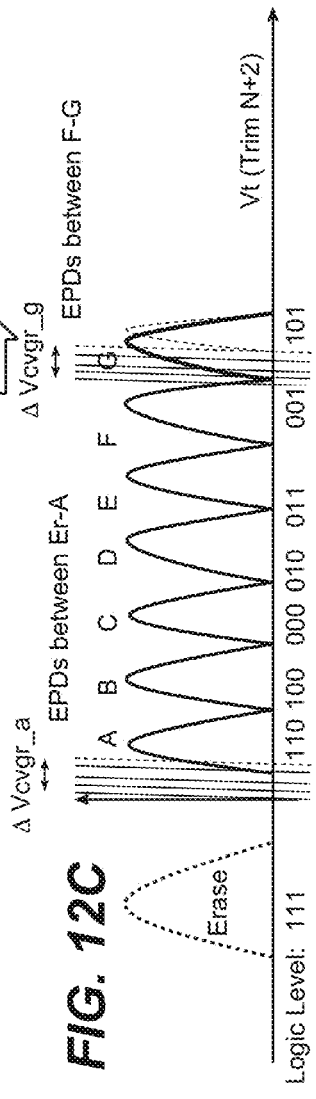

ADAPTIVE BLOCK PARAMETERS

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

In some nonvolatile block-erasable memory systems, memory characteristics change over time. Operating parameters may be changed accordingly so that memory operation adapts to changes in memory characteristics. Changing characteristics may be tested by checking for memory cells that have marginal threshold voltages between threshold voltage ranges assigned to logic states. Such testing may occur during polling cycles, which occur periodically to check block characteristics. If the numbers of such cells exceed a predetermined limit, then the corresponding block may be made unavailable for further use with current parameters. Other blocks may continue to be used as long as they do not exceed the limit. When the number of unavailable blocks reaches a maximum then block operating parameters may be modified for all blocks. The modification of block parameters may be based on the testing so that the new operating parameters (e.g. program voltages, read voltages, etc.) are offset from previous operating parameters according to test results.

An example of a method of operating a nonvolatile block-erasable memory includes: programming data in a plurality of memory cells in a block of the nonvolatile block-erasable memory using a first set of programming parameters; subsequently performing a read operation to determine a number of memory cells of the plurality of memory cells having threshold voltages in an intermediate threshold voltage range that is between a first range assigned to a first logic state and a second range assigned to a second logic state; subsequently, comparing the number to a threshold number; and if the number exceeds the threshold number then performing subsequent programming of the block using a second set of programming parameters.

If the number exceeds the threshold number then the block may be designated as temporarily unavailable for further programming, or designated as a reserve block that is only available for further programming when no other blocks are available. Subsequently, in response to determining that a fraction of blocks that are designated as unavailable for use has reached a predetermined fraction of all blocks in the nonvolatile block-erasable memory, the first set of programming parameters may be replaced with the second set of programming parameters for all blocks of the nonvolatile block-erasable memory so that subsequent programming of blocks of the nonvolatile block-erasable memory is performed using the second set of programming parameters. Subsequent to replacing the first set of programming parameters with the second set of programming parameters, all blocks previously designated as temporarily unavailable for use may be designated as available and may subsequently be programmed using the second set of programming parameters. A write-erase cycle count may be maintained for the block, and the threshold number may be a function of the write-erase cycle count. The threshold number may increase with increasing write-erase cycle count. Data stored in the nonvolatile block-erasable memory may be subject to Error Correction Code (ECC) encoding prior to storage and ECC decoding after reading, and the threshold number may be selected so that data having fewer than the threshold number of cells in the intermediate threshold voltage range is correctable by the ECC decoding. If the number exceeds the threshold, an additional read operation may be performed to determine an additional number of memory cells of the plurality of memory cells having threshold voltages in another intermediate threshold voltage range that is different to the first range; and subsequently, the additional number may be compared to the threshold number. Further additional reads may be performed to identify distributions of memory cells and subsequently reading and programming parameters may be modified according to the distributions of memory cells identified by the additional read and the further additional reads. The programming, the read operation, and the comparing may be performed in a polling cycle that provides block health data, the polling cycle triggered by a block write-erase cycle count. A polling cycle may be triggered after every N regular write-erase cycles of the block, a polling cycle for the block using different accessing parameters than regular write-erase cycles.

An example of a method of operating a nonvolatile block-erasable memory includes: programming data in a plurality of blocks of the nonvolatile block-erasable memory using a first set of programming parameters; subsequently performing read operations on the plurality of blocks to determine, for each block, a number of marginal memory cells of the block, a marginal memory cell having a threshold voltage in a marginal threshold voltage range that extends between a first range assigned to a first logic state and a second range assigned to a second logic state; subsequently, aggregating the numbers of marginal memory cells for the plurality of blocks to obtain an aggregated number; subsequently, comparing the aggregated number to a threshold; and if the aggregated number exceeds the threshold then performing subsequent programming of the plurality of blocks using a second set of programming parameters.

The aggregated number may be an average of the plurality of blocks. The aggregated number may be a number of blocks of the plurality of blocks that individually have numbers of marginal memory cells that exceed a predetermined number. High resolution read operations may be performed on the plurality of blocks to identify distributions of cells and the second set of programming parameters may be selected according to the identified distributions of cells. Read parameters may be modified according to the identified distributions of cells. A read operation on an individual block to determine the number of marginal memory cells in the block may be performed in a polling cycle that is triggered by a write erase cycle count of the block reaching a predetermined count.

An example of a nonvolatile block-erasable memory system may include: a plurality of blocks of nonvolatile memory cells; a programming circuit that is configured to program memory cells to two or more predetermined threshold voltage ranges that correspond to two or more logic states; a reading circuit that is configured to, in a conventional read mode identify cells in threshold voltage ranges assigned to logic states, and in a diagnostic mode identify marginal cells that have threshold voltages in marginal threshold voltage ranges; and a reconfiguration unit that is configured to reconfigure assignment of the threshold voltage ranges to logic states for the plurality of blocks in response to numbers of marginal cells identified by the reading circuit in the diagnostic mode.

A write-erase cycle counter may individually count a number of write-erase cycles experienced by each of the plurality of blocks of nonvolatile memory cells, and the diagnostic mode may be triggered for an individual block by the number of write-erase cycles experienced by the block reaching a predetermined number. The reconfiguration unit may be configured to individually reconfigure assignment of the threshold voltage ranges to logic states on a block-by-block basis. An aggregating unit may aggregate numbers of marginal cells of the plurality of blocks to obtain an aggregated metric, and the reconfiguration unit may be configured to reconfigure the plurality of blocks of nonvolatile memory cells together in response to the aggregated metric reaching a predetermined level.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIGS. 11A-B illustrate examples of marginal cells (erratic bits).

FIGS. 12A-C illustrate operating parameters changing in response to testing.

DETAILED DESCRIPTION

Memory System

Figure 1:
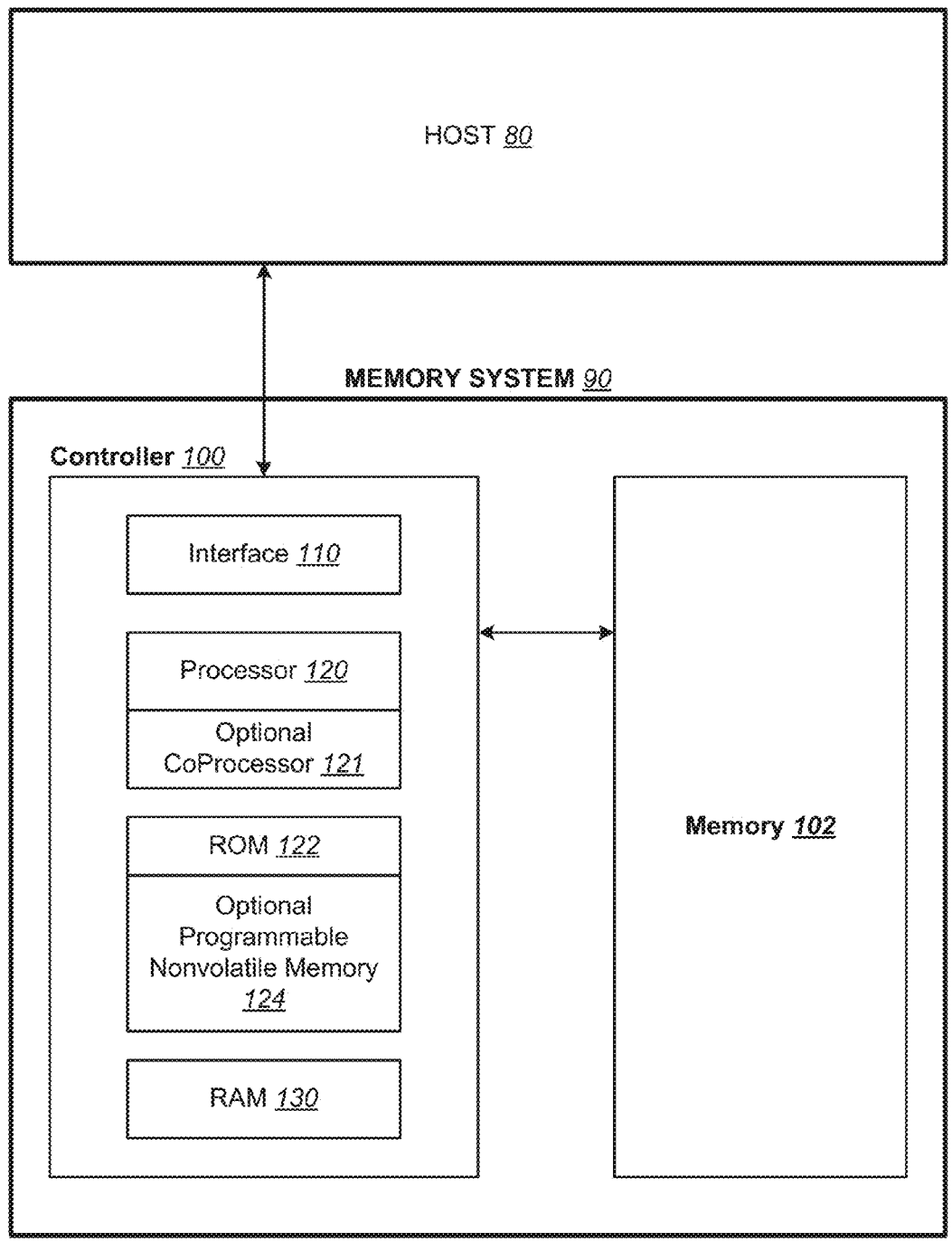
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
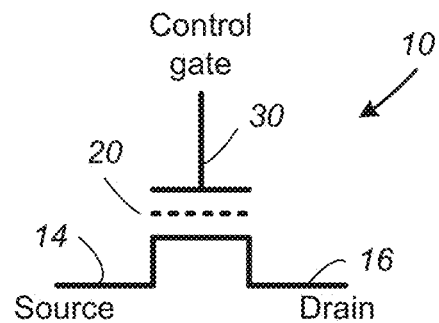
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
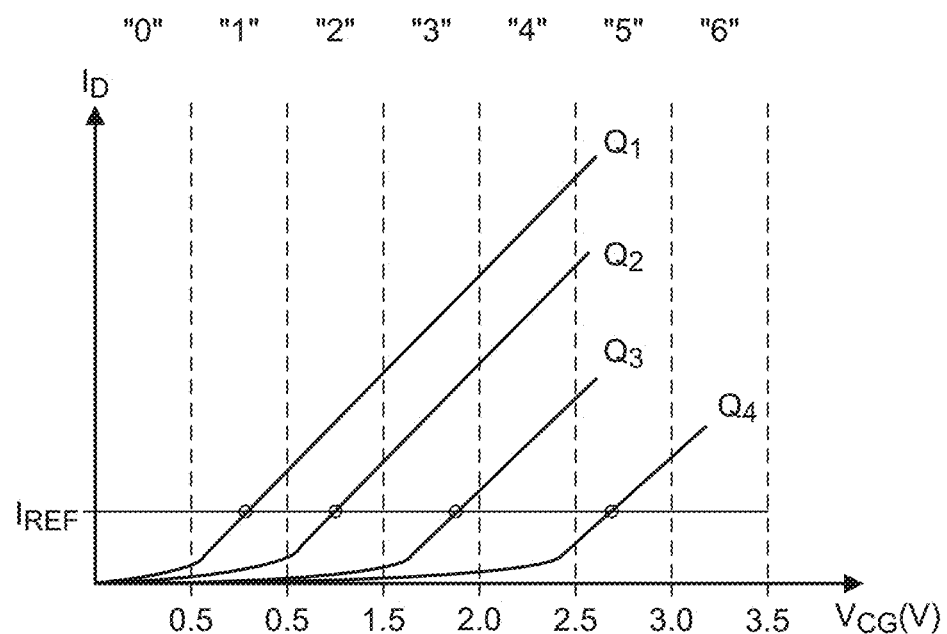
FIG. 3 illustrates the relation between the source-drain current $I_D$ and the control gate voltage $V_{CG}$ for four different charges Q1-Q4 that a floating gate may store.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
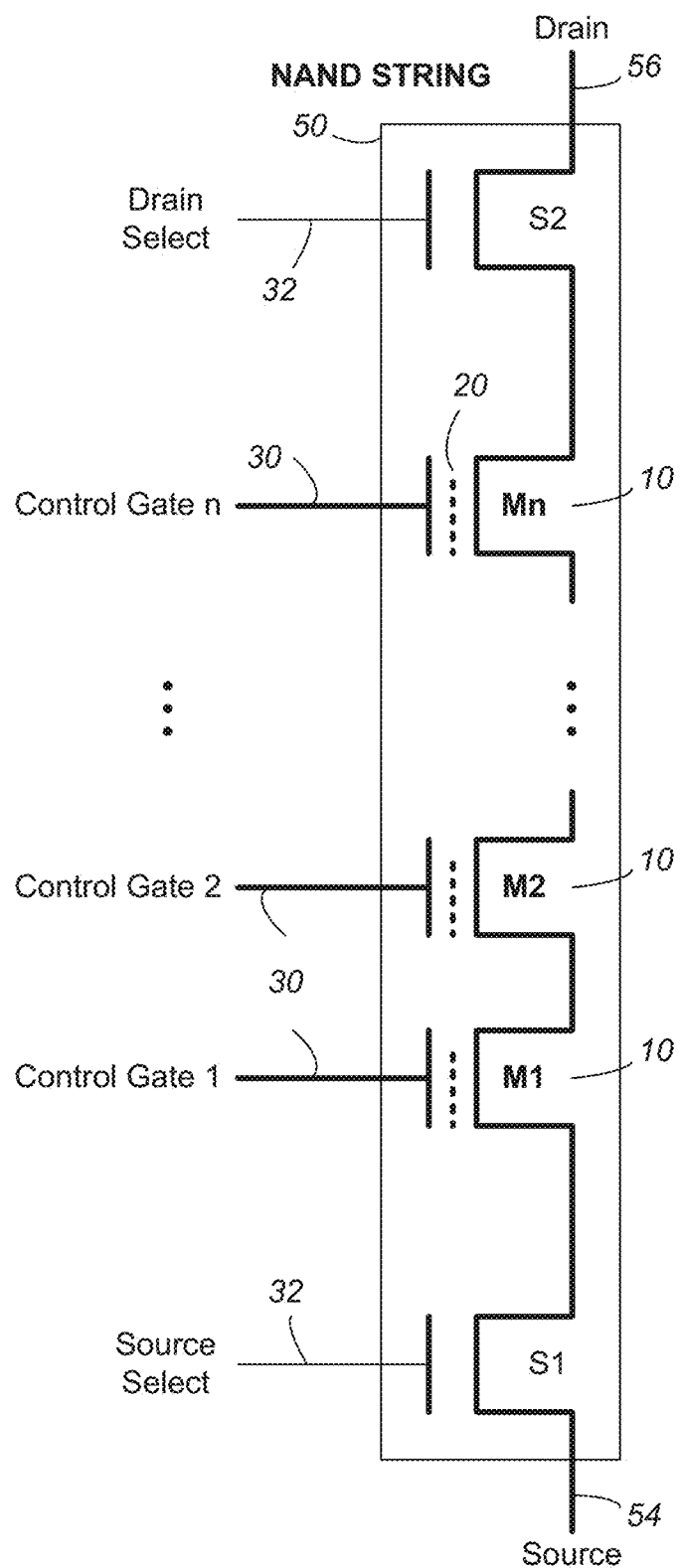
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
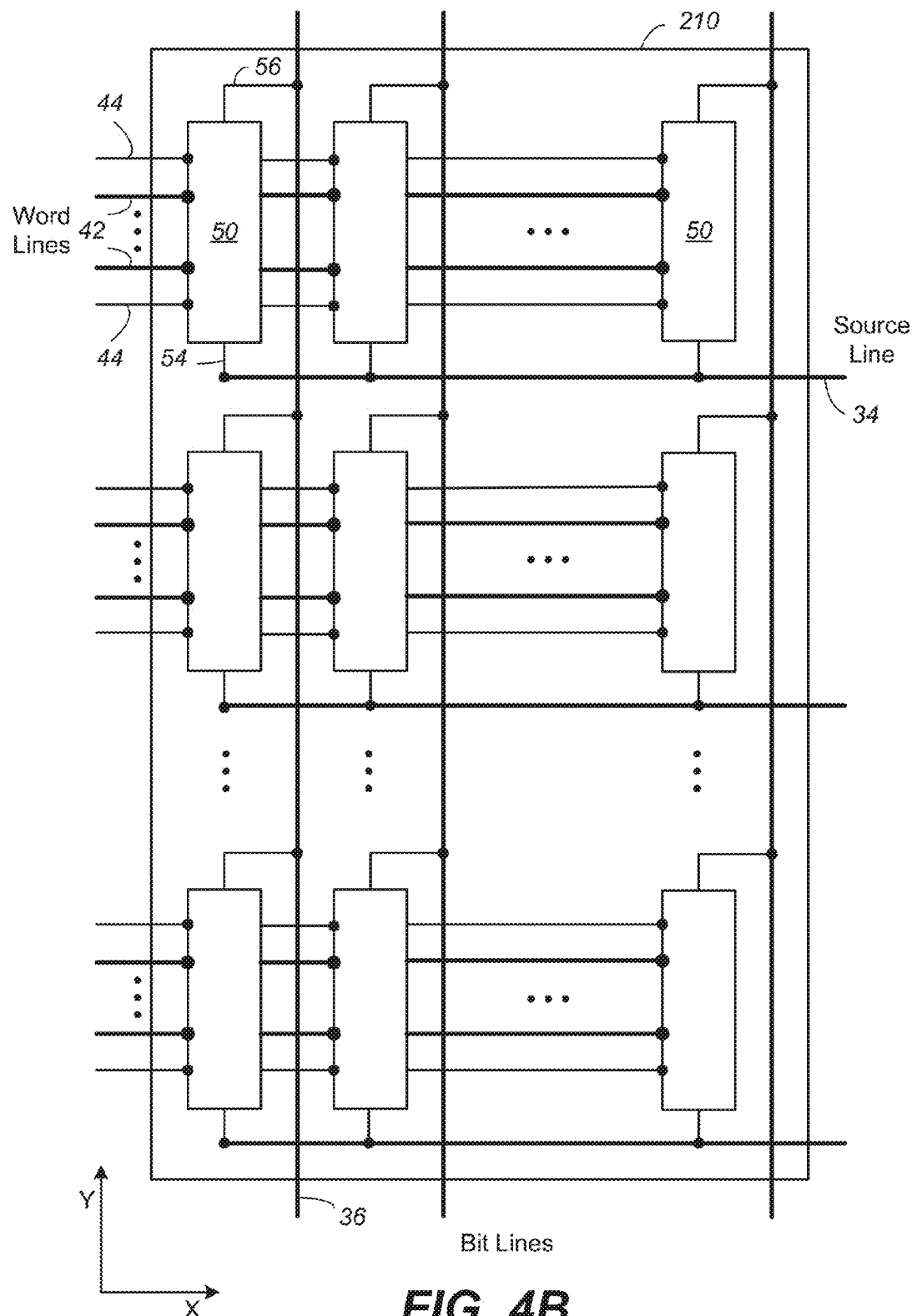
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
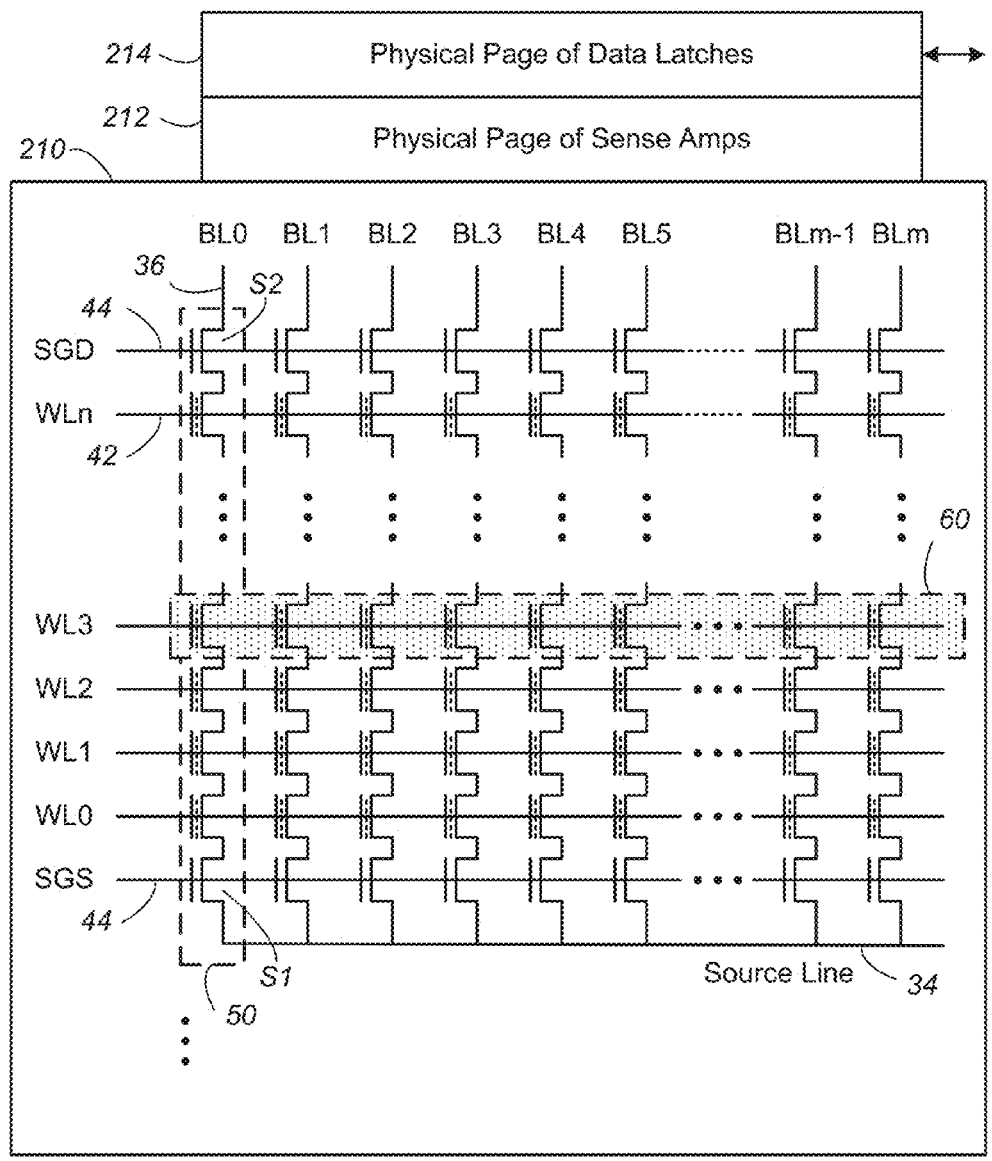
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 7:
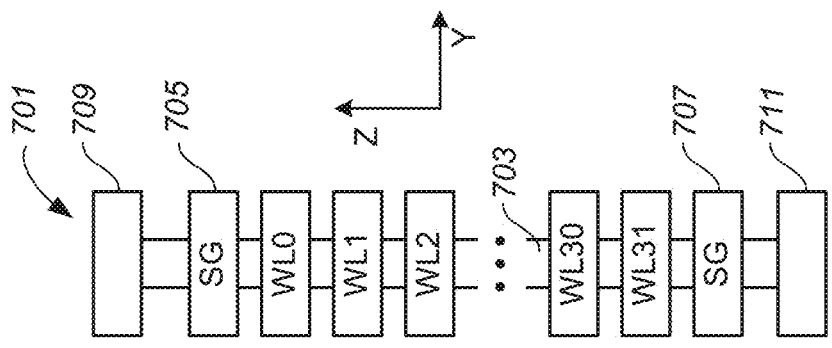
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
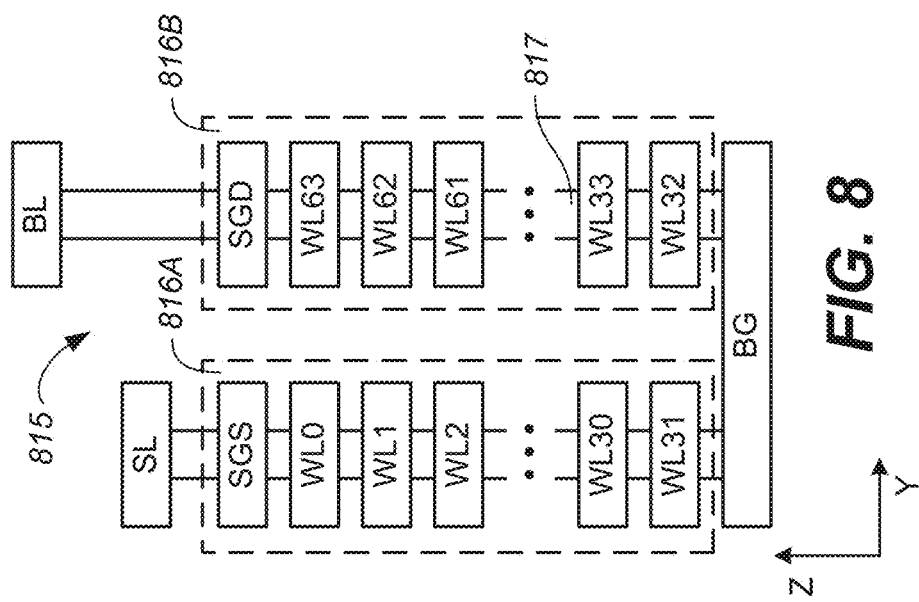
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
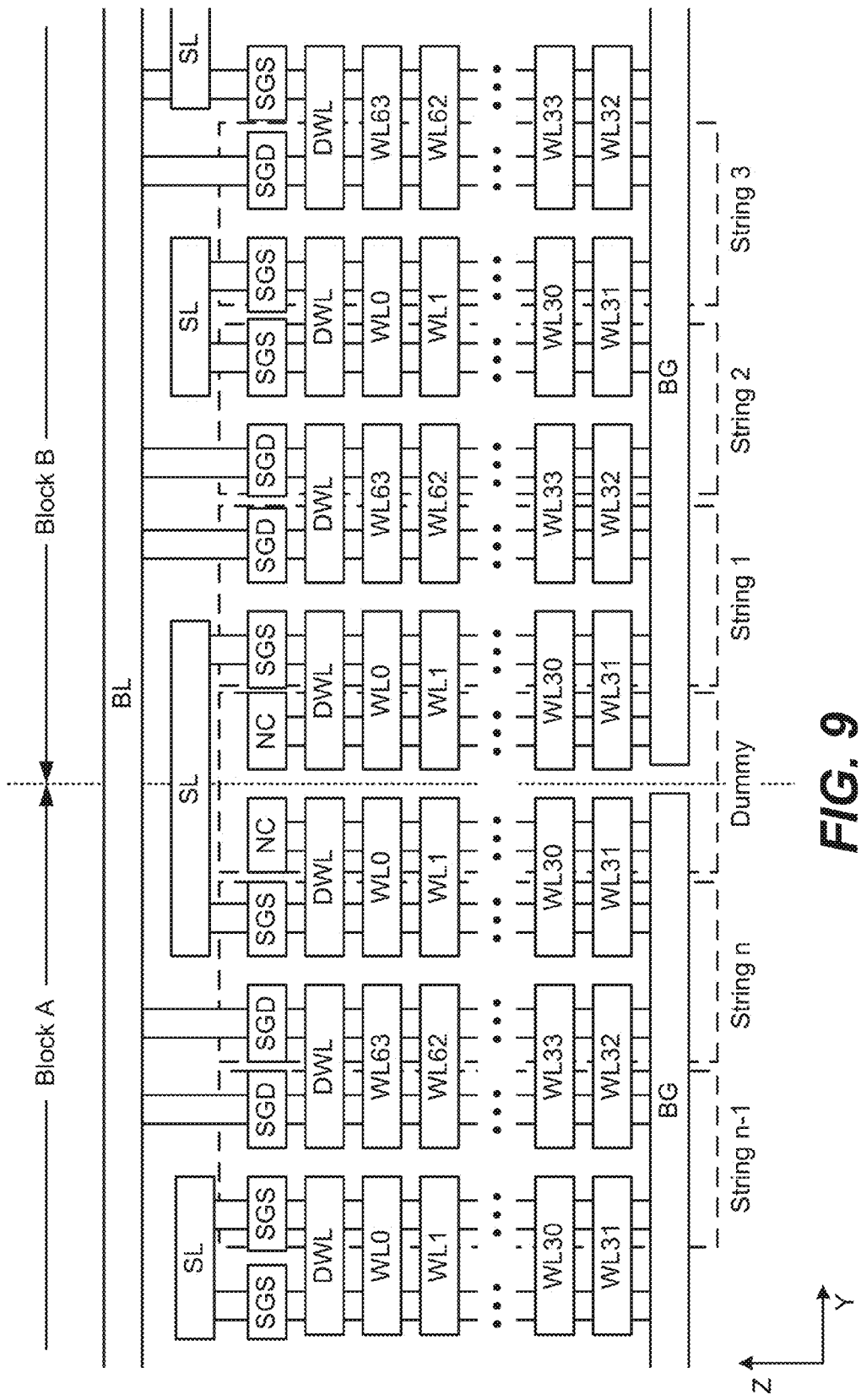
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
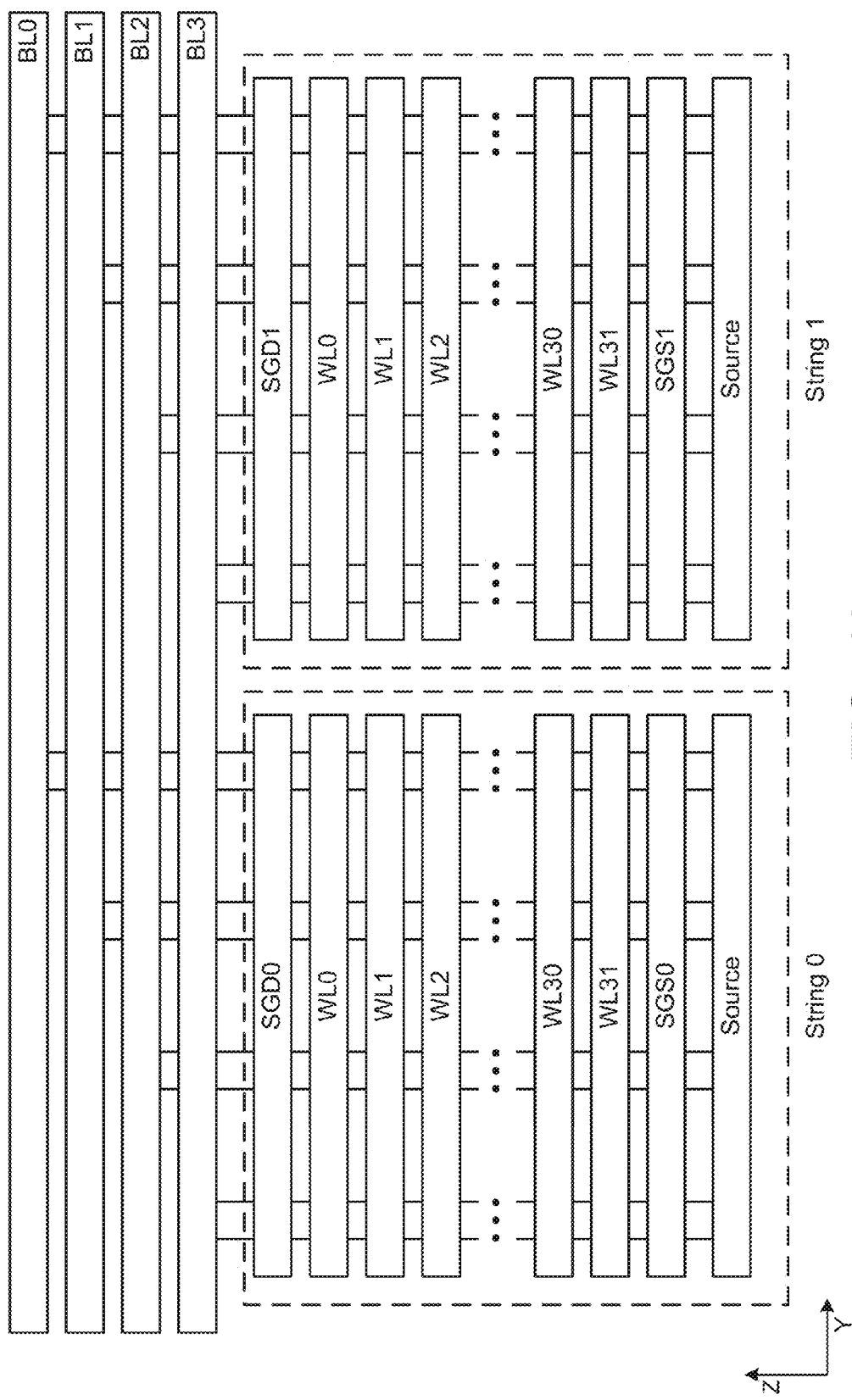
FIG. 10 shows an example of a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Marginal Cells

Ideally, programming results in memory cells having threshold voltage distributions that are narrowly centered within threshold voltage ranges that are assigned to particular logic states. However, real programmed memory cells may have threshold voltages that do not remain neatly within ideal ranges. Within a population of real memory cells, some memory cells generally have threshold voltages within marginal ranges that are between the programmed threshold voltage ranges or at edges of programmed threshold voltage ranges. When such memory cells are read there is a high probability of bad bits. Thus, as the numbers of marginal memory cells between assigned threshold voltage ranges increases, the number of bad bits tends to increase, and the resources needed to perform Error Correction Code (ECC) correction of the data may increase. If the number of bad bits becomes too high then the data may be uncorrectable by ECC (UECC). It is generally desirable to avoid such an outcome.

As cells wear (undergo repeated programming and erase) the number of cells in marginal threshold voltage ranges, and thus the number of bad bits, tends to increase. In order to avoid data being UECC, various measures may be taken. For example, operating parameters may be adjusted to reduce the number of marginal cells and thereby reduce the number of bad bits. For example, operating parameters may be adjusted to modify threshold voltage ranges assigned to different logic states as the memory changes with wear.

FIG. 11A illustrates an example of two distributions 101, 103 of memory cells corresponding to two different logic states, with a range 105 of marginal threshold voltages (control gate voltage DVCG that turns cell on) between distributions 101-103 (between DVCG_H and DVCG_L in FIG. 11A). In general, if a relatively small number of cells have marginal threshold voltages then ECC correction can be used to correct the resulting bad bits. Keeping the number of such bad bits low allows ECC correction to be performed rapidly and without consuming excessive resources.

In some cases, memory cell threshold voltage distributions extend into marginal threshold voltage ranges as cells undergo wear. Thus, the upper edges of distributions 101 and 103 may tend to move to the right (increasing Vt) with wear and the number of cells in range 105 (number of cells with marginal threshold voltage) increases.

FIG. 11B illustrates a series of reads to provide high resolution information regarding threshold voltage distributions 107, 109 for memory cells of a unit such as a block. Reading may be repeated using different discrimination voltages to determine where the edge of a particular threshold voltage distribution associated with a logic state is located (e.g. where upper edge of distribution 107 is located). The results of such a high resolution read may be used to determine if the unit is working within acceptable limits. Such a high resolution read may require significant time and may be performed periodically as part of a diagnostic operation. For example, a "polling cycle" may be performed at intervals of write-erase cycle (also referred to as program erase cycle—the terms are used interchangeably here) so that after N cycles of a block a high resolution read (and other testing) may be performed to identify if the block continues to operate in an acceptable manner.

When a block is not operating within acceptable limits some corrective action may be taken to restore operation of the block so that it can remain in use. For example, as threshold voltage distributions associated with logic states extend, and the number of marginal cells increases, programming voltages may be adjusted to increase threshold voltage ranges for logic states. Thus, threshold voltage ranges may broaden, and move up in voltage as a block ages. Threshold ranges that are considered marginal may change accordingly. In general, such a change may occur in response to a determination that some limit has been reached, e.g. a determination that the number of marginal cells has reached a limit.

FIGS. 12A-C illustrate threshold voltage distributions (erase, and A-G) of programmed memory cells of a block in three successive phases of operation (with trim N to N+2), separated by two reconfiguration operations (trim operations). FIG. 12A shows operation during a first phase of operation with a first set of operating parameters ("Trim N"). This may be a default set of operating parameters that is used from initialization. In general, a set of operating parameters may be used for an extended period of time (a number of write erase cycles) until there is some indication that a change is appropriate.

High resolution reads of certain threshold voltage ranges are illustrated between the erase state and A state and between the F and G states. (The memory uses eight states to store three bits per cell in this example.) Such high resolution reads may be performed in polling cycles. These high resolution reads may determine the numbers of marginal cells between the erased state and the A state ("EPDs between Er-A" where "EPD" stands for "Erratic Program distribution" i.e. the number of erratic or marginal bits) and between the F and G states ("EPDs between F-G"). Thus, the lower edge of the A state distribution, Vcvgr_a, and of the G state distribution, Vcvgr_g may be found. This information may be used to determine that a change in block operating parameters is appropriate. In this example, program verify voltages for A and G states are changed by ΔVcvgr_a and ΔVcgr_g respectively.

FIG. 12B illustrates a second phase of operation ("Trim N+1") in which a second set of operating parameters are used so that threshold voltage distributions A and G are shifted up in voltage by ΔVcgr_a and ΔVcgr_g. Thus, the threshold voltage range that is mapped to the G state is shifted up as shown and lower distributions are shifted upwards accordingly. The block may operate in the second phase for an extended period of time until a polling cycle indicates that block operation is no longer within acceptable limits using the second set of operating parameters. FIG. 12B shows high resolution reads performed as in FIG. 12A to identify marginal cells between the erased state and A state and between the F and G states. Appropriate modification of operating parameters may be made in response to the numbers of marginal cells found. In this case, program verify voltages are again increased.

FIG. 12C illustrates a third phase of operation ("Trim N+2") in which a third set of operating parameters are used so that threshold voltage distributions are shifted up further in voltage. Such modification may occur any number of times during the lifecycle of the block. While the example of FIGS. 12A-C shows high resolution reads of two ranges, high resolution reads may be performed at any number of locations (e.g. one location may be enough, or three or more locations may be read). It will be understood that a number of polling cycles may be performed on the block without triggering any change in operating parameters between the changes shown. Thus, each phase may extend for a significant number of write erase cycles including multiple polling cycles.

While changes in block operating parameters may be triggered by results obtained during a polling cycle, other triggers may also be used. For example, increased numbers of bad bits found by ECC correction may trigger a change in parameters.

While parameters may be changed on a block-by-block basis, such an arrangement may be complex to manage in a memory array that includes a large number of blocks (e.g. parameters could be individually recorded for each block and retrieved and used according to the block being addressed). An alternative approach is to change block operating parameters for a number of blocks together. For example, block operating parameters for all blocks of a die or a number of dies may be modified together. Determining an appropriate time to update block operating parameters for a die, or other unit, may be done in a number of ways.

In one example, blocks are checked (e.g. by performing polling cycles at intervals) and when an individual block reaches a limit (e.g. has a number of marginal cells that equals or exceeds a predetermined limit) then the block is made unavailable for further programming in the current phase. Other blocks may continue to be used until they in turn reach the limit. In this way, blocks are made temporarily unavailable as they reach their limits. Such unavailable blocks may be completely unavailable (i.e. not available for any purpose under any circumstances) or may have some limited availability under limited circumstances. For example, such blocks may be held in reserve for emergency use only (e.g. if a large host write occurs and there is inadequate space to store the new data). If such blocks are operated they may use additional redundancy (e.g. different or additional ECC), or may operate differently (e.g. storing data in different format such as in SLC format instead of MLC format). Only when a certain percentage of the blocks of the die reach the limit are the block operating parameters modified.

Wear Distribution

Figure 13:
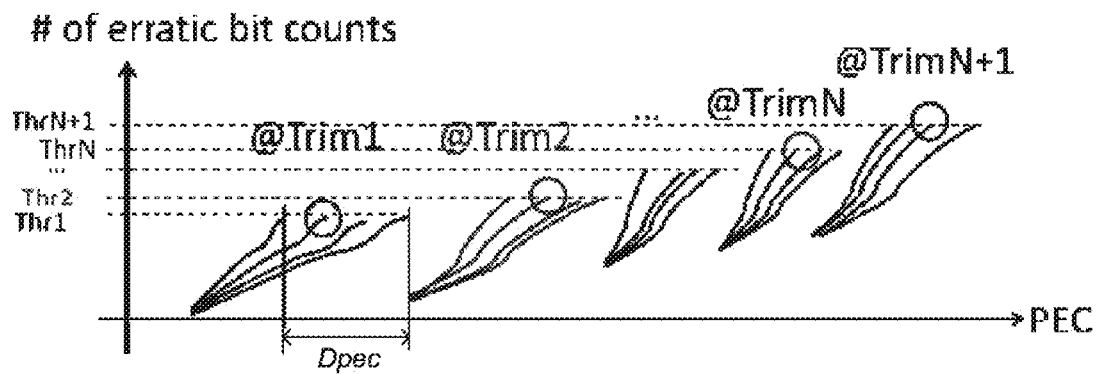
FIG. 13 shows how blocks operate with different operating parameters as they wear.

FIG. 13 illustrates how a group of blocks progress through multiple trim operations over many write-erase cycles, or Program Erase Count ("PEC"). Initially, during a first phase with a first set of block operating parameters ("@Trim1"), a first threshold number, "Thr1", is set for the maximum number of marginal cells (maximum erratic bit count). Blocks go through a number of cycles and reach the limit, Thr1, after different numbers of cycles. As they reach the limit, they are made temporarily unavailable until a subsequent trim operation changes block operating parameters for a second phase. With the new block operating parameters ("@Trim2") the number of erratic bits is reduced and operation continues (blocks are shown having the same PEC at the start of the second phase for clearer illustration even though they have finished the first phase with different PECs). A higher threshold number for erratic bits is set for the second phase. In general, the number of errors increases with wear so that the maximum number may be increased from phase to phase.

FIG. 13 shows a number of phases (up to N+1) with block operating parameters changed between each phase so that the number of erratic bits is reduced to an acceptable level (and the limit raised according to PEC). One consequence of operating in this manner is a form of wear distribution that may provide more even wear-out. Traditional wear-leveling techniques attempt to equalize numbers of write-erase cycle counts for all blocks. However, blocks are not identical and do not wear identically. Thus, while one block may wear out after N cycles, another block may operate acceptably after 2N cycles. So leveling wear (by maintaining equal PEC) does not mean blocks approach wear-out at the same rate. In the example of FIG. 13, a weak block that experiences a high number of erratic bits is locked out (made unavailable) sooner in a given cycle than a block that experiences a smaller number of erratic bits. Thus, in FIG. 13, the weakest block experiences fewer cycles in a given phase. For example, the weakest block starts the second phase with a real PEC that is less than the strongest block by Dpec. It can be seen that this system reduces wear on weaker blocks (blocks with higher numbers of erratic bits) and increases wear on stronger blocks (blocks with lower numbers of erratic bits). Thus, the system achieves wear concentration in blocks that are better suited to high wear and achieves wear reduction in blocks that are less suited to high wear. Such uneven wear distribution is tailored to block-specific characteristics and is thus highly adaptive. In contrast, conventional wear leveling is generally based on the assumption that blocks have similar characteristics and will change uniformly if wear is uniform. This assumption may be erroneous in some memories so that wear leveling may not be appropriate and calibrated wear concentration may provide better results.

Figure 14:
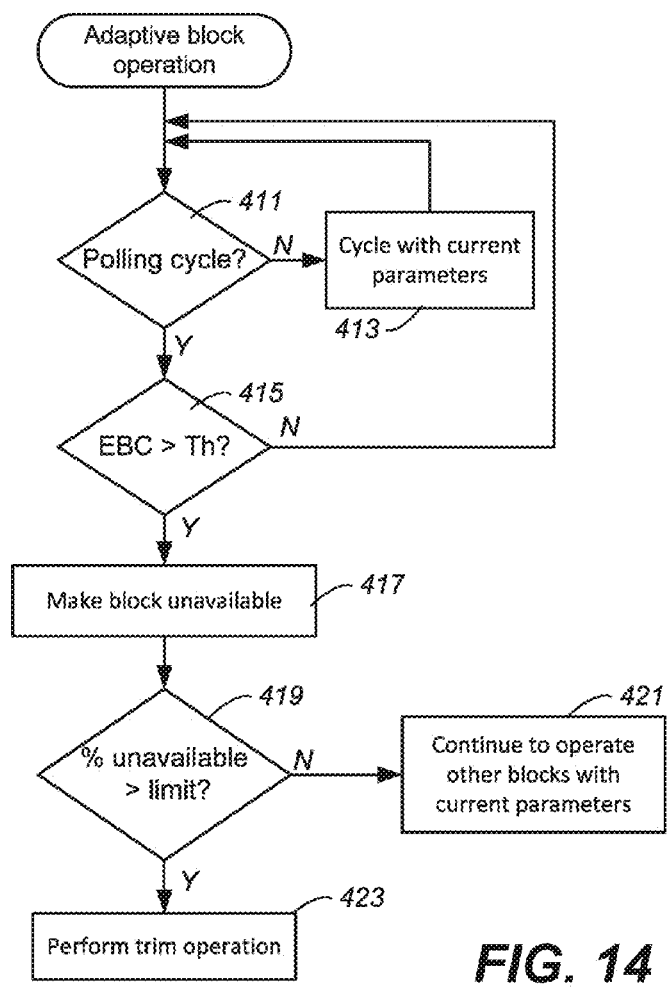
FIG. 14 illustrates adaptive operation of memory blocks.

FIG. 14 illustrates steps in adaptive operation of a number of blocks in a block erasable memory (e.g. blocks of a given die, plane, or in a multi-die array). For a given block, a determination is made 411 as to whether the current cycle is a polling cycle or not. If the current cycle is not a polling cycle then the current parameters are used to program data and read data normally 413. The PEC is incremented when an erase is performed and another cycle begins. In a polling cycle a determination is made as to whether the EBC exceeds a threshold 415. If the EBC does not exceed the threshold then regular cycles may resume with the current parameters. If the EBC exceeds the threshold then the block is made unavailable for use 417 for the remainder of the current operating phase (i.e. for as long as the current parameters remain in use). A determination is made as to how many blocks are unavailable 419. If the number or percentage of unavailable blocks does not exceed a limit then the memory continues to operate other blocks with the current parameters 421. However, if the number or percentage of unavailable blocks exceeds the limit then a trim operation is performed 423 so that a new set of block access parameters are implemented for all blocks and blocks that were made unavailable during the prior phase are made available again.

Figure 15:
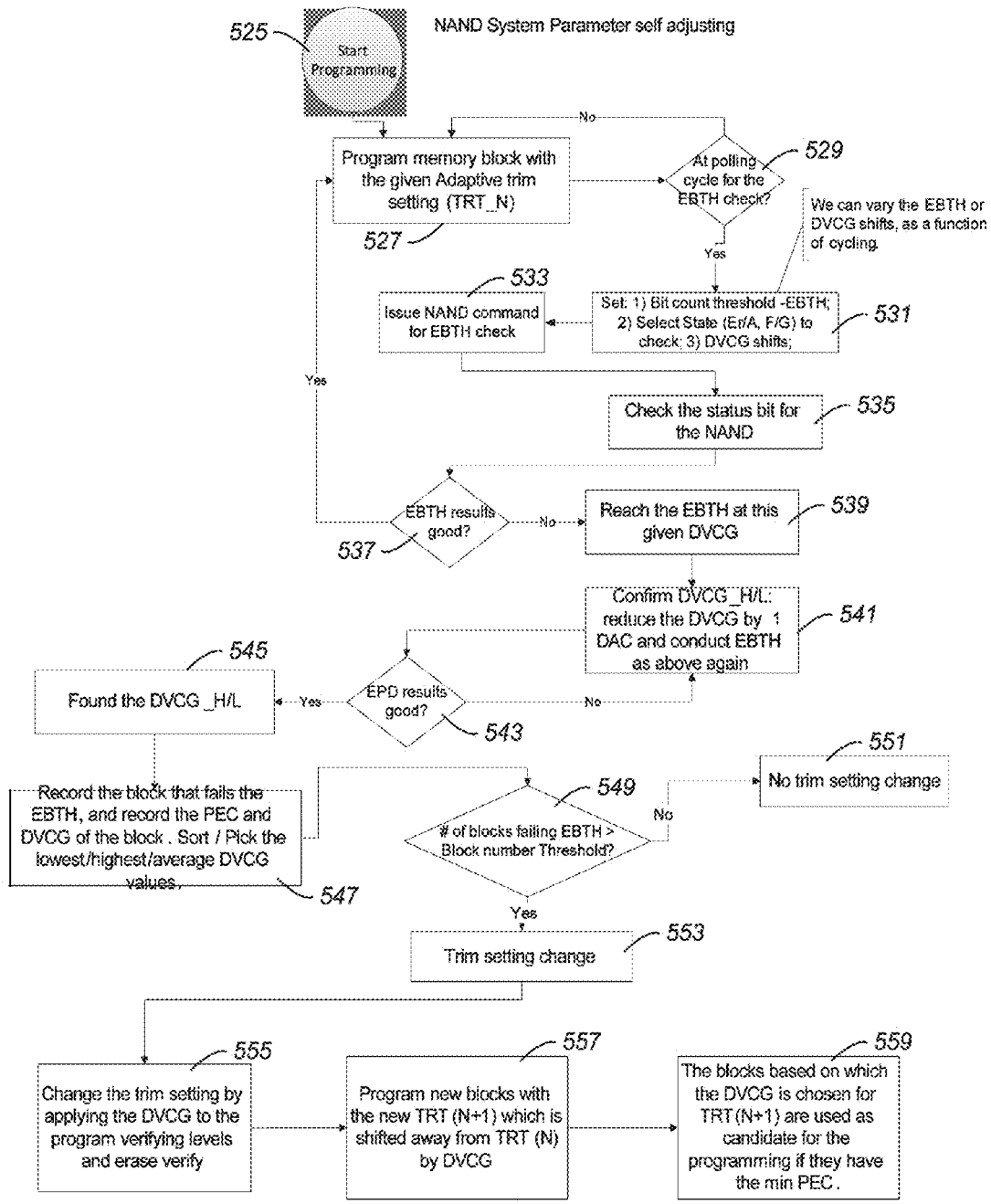
FIG. 15 shows a more detailed illustration of adaptive operation.

FIG. 15 shows a more detailed example of an adaptive scheme in which a NAND flash memory system adjusts parameters as a memory changes with wear. When programming is initiated 525, a memory block is programmed with the current trim settings TRT_N 525 (i.e. with the current block operating parameters, which may be the same for all blocks in a die). If the current cycle is a polling cycle 529 then testing parameters (maximum number of erratic bits, states to be checked, and read voltages to use during testing) are set 531 and a command is issued to check for erratic bits 533 (Erratic Bit Threshold "EBTH" check). The memory controller then checks the status of the NAND memory die. When the status indicates that the check is complete (i.e. status=ready) then a determination is made as to whether the EBTH results were good 537 (i.e. whether the number of erratic, or marginal bits was below a predetermined maximum number). If the results were good, then the block may continue to be used as before with the current trim settings 527. If the results are not good then further reads may be performed 539 to establish where the threshold voltage distributions lie (i.e. what values of DVCG_H and DVCG_L produce an acceptable number of erratic bits 541). A number of iterations 543 may be needed to find DVCG_H and DVCG_L 545. A record is updated 547 to indicate that the block failed so that the block is made unavailable for further storage of data using the current trim settings. The PEC is recorded and the DVCG_H and DVCG_L values found by testing are recorded and may be combined with similar values from other blocks (e.g. may be aggregated by finding the lowest and highest, or by averaging, or otherwise combining). If the number of failed blocks is less than a threshold number 549 then the remaining blocks that have not failed may continue to be used with the current trim settings 551. If the number of blocks failing testing exceeds the threshold number 549 then trim settings are changed 553. The changes are based on the testing results 555 (e.g. on the aggregated DVCG_H and DVCG_L from the blocks that failed). Thus, the direction and magnitude of the changes in program verify voltages are obtained from testing and are adaptive to the observed changes in the tested blocks. Subsequently, all blocks in the die (or other unit) are programmed using the new trim settings "TRT(N+1)" 557 which are different from settings TRT(N). The blocks that previously failed testing using TRT(N) are returned to operation 559 with settings TRT(N+1) if they have a minimum PEC. If they do not have the minimum PEC then their failure may not reflect normal wear and may indicate a physical defect so that such blocks are not returned to use.

Figure 16:
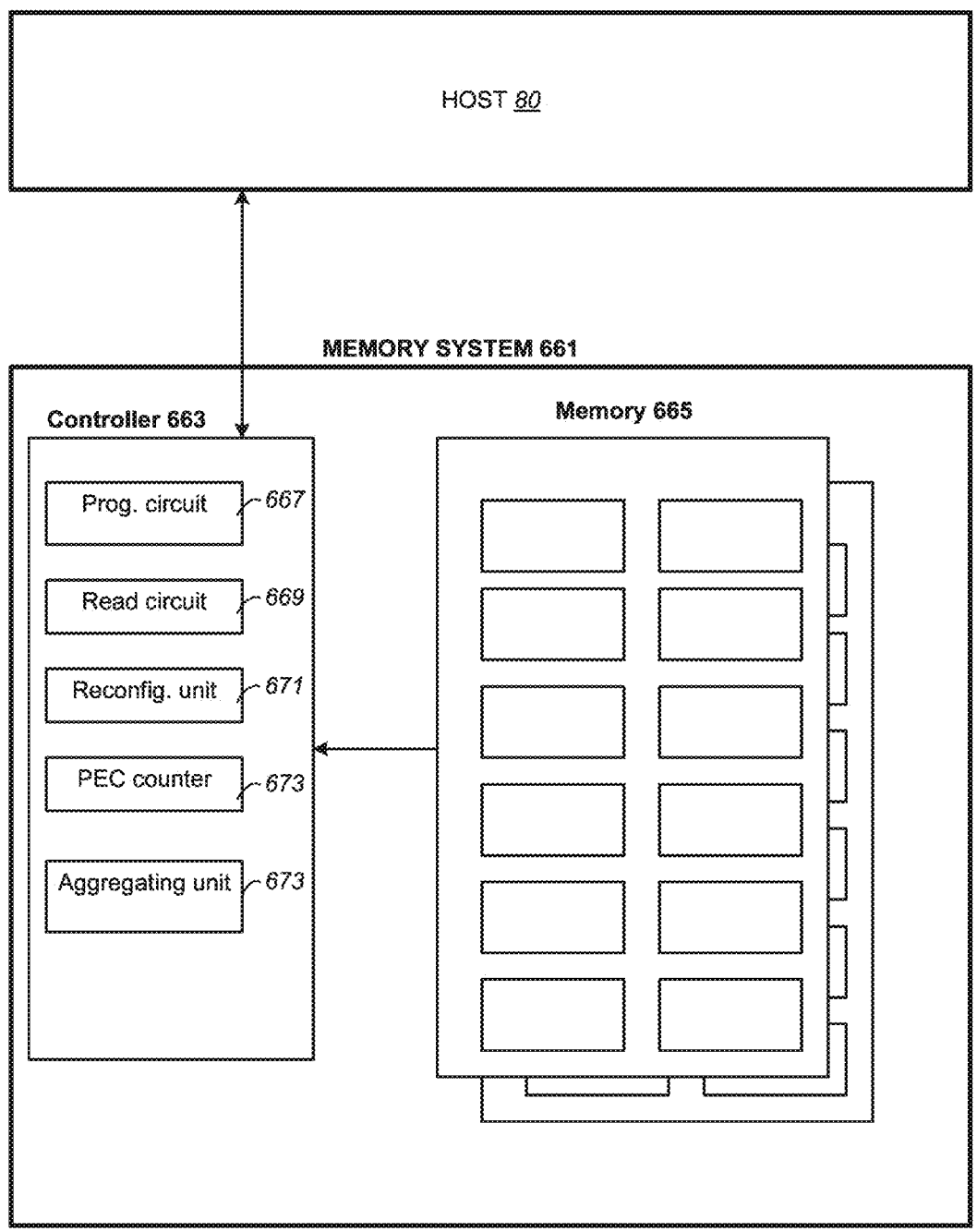
FIG. 16 shows a memory system configured for adaptive block operation.

FIG. 16 shows an example of a memory system 661 that may incorporate some or all of the techniques described above. Memory system 661 is connected to a host 80 (e.g. through an interface such as a USB connection, or other interface). Memory system 661 includes a memory controller 663 and memory 665, which includes multiple dies, with each die containing multiple individually-erasable blocks. Memory controller 661 includes a programming circuit 667 that is configured to program memory cells to two or more predetermined threshold voltage ranges that correspond to two or more logic states and a reading circuit 669 that is configured to, in a conventional read mode identify cells in threshold voltage ranges assigned to logic states, and in a diagnostic mode identify marginal cells that have threshold voltages in marginal threshold voltage ranges. Memory controller 663 also includes a reconfiguration unit 671 that is configured to reconfigure operating parameters such as read voltages and programming voltages for a given die. Thus, assignment of the threshold voltage ranges to logic states for blocks of a die may be modified by reconfiguration unit 671 in response to numbers of marginal cells identified by the reading circuit in the diagnostic mode exceeding a predetermined number.

A write-erase, or program-erase cycle (PEC) counter 673 individually counts a number of write-erase cycles experienced by each of the plurality of blocks. The diagnostic mode may be triggered for an individual block by the number of write-erase cycles experienced by the block reaching a predetermined number. The reconfiguration unit 671 may individually reconfigure assignment of the threshold voltage ranges to logic states on a block-by-block basis or in some larger unit (e.g. all blocks of a plane, die, or other unit may be reconfigured together). An aggregating unit 675 aggregates numbers of marginal cells to obtain an aggregated metric so that blocks are reconfigured together in response to the aggregated metric reaching a predetermined level.

While the components of memory controller 663 are shown as separate units, it will be understood that such components may be physically separate dedicated circuits, or may share some common circuitry. In some cases, some or all units may be implemented in other ways (i.e. not as dedicated circuits). For example, programmable logic, or field programmable gate array (FPGA) circuits may be configured to implement certain functions. In other cases, some general purpose circuits may be configured using software (e.g. firmware) to perform specific functions. Some combination of dedicated circuits, programmable logic, and/or software may be used in some implementations.

Conclusion

The foregoing detailed description has been presented for purposes of illustration and description. It is not intended to be exhaustive or to limit the attached claims. Many modifications and variations are possible in light of the above teaching.

It is claimed:

1. A method of operating a nonvolatile block-erasable memory comprising:
    programming data in a plurality of memory cells in a block of the nonvolatile block-erasable memory using a first set of programming parameters;
    subsequently performing a read operation to determine a number of memory cells of the plurality of memory cells having threshold voltages in an intermediate threshold voltage range that is between a first range assigned to a first logic state and a second range assigned to a second logic state;

subsequently, comparing the number to a threshold number; and
if the number exceeds the threshold number then performing subsequent programming of the block using a second set of programming parameters.

2. The method of claim 1 wherein, if the number exceeds the threshold number then the block is designated as temporarily unavailable for further programming, or designated as a reserve block that is only available for further programming when no other blocks are available.

3. The method of claim 2 further comprising, subsequently, determining that a fraction of blocks that are designated as unavailable for use has reached a predetermined fraction of all blocks in the nonvolatile block-erasable memory and, in response, replacing the first set of programming parameters with the second set of programming parameters for all blocks of the nonvolatile block-erasable memory so that subsequent programming of blocks of the nonvolatile block-erasable memory is performed using the second set of programming parameters.

4. The method of claim 3 wherein, subsequent to replacing the first set of programming parameters with the second set of programming parameters, all blocks previously designated as temporarily unavailable for use are designated as available and are subsequently programmed using the second set of programming parameters.

5. The method of claim 1 further comprising maintaining a write-erase cycle count for the block, and wherein the threshold number is a function of the write-erase cycle count.

6. The method of claim 5 wherein the threshold number increases with increasing write-erase cycle count.

7. The method of claim 1 wherein data stored in the nonvolatile block-erasable memory is subject to Error Correction Code (ECC) encoding prior to storage and ECC decoding after reading, and wherein the threshold number is selected so that data having fewer than the threshold number of cells in the intermediate threshold voltage range is correctable by the ECC decoding.

8. The method of claim 1 further comprising;
if the number exceeds the threshold, performing an additional read operation to determine an additional number of memory cells of the plurality of memory cells having threshold voltages in another intermediate threshold voltage range that is different to the first range; and
subsequently, comparing the additional number to the threshold number.

9. The method of claim 8 further comprising performing further additional reads to identify distributions of memory cells and subsequently modifying reading and programming parameters according to the distributions of memory cells identified by the additional read and the further additional reads.

10. The method of claim 1 wherein the programming, the read operation, and the comparing are performed in a polling cycle that provides block health data, the polling cycle triggered by a block write-erase cycle count.

11. The method of claim 10 wherein a polling cycle is triggered after every N regular write-erase cycles of the block, a polling cycle for the block using different accessing parameters than regular write-erase cycles.

12. A method of operating a nonvolatile block-erasable memory comprising:
programming data in a plurality of blocks of the nonvolatile block-erasable memory using a first set of programming parameters;
subsequently performing read operations on the plurality of blocks to determine, for each block, a number of marginal memory cells of the block, a marginal memory cell having a threshold voltage in a marginal threshold voltage range that extends between a first range assigned to a first logic state and a second range assigned to a second logic state;
subsequently, aggregating the numbers of marginal memory cells for the plurality of blocks to obtain an aggregated number;
subsequently, comparing the aggregated number to a threshold; and
if the aggregated number exceeds the threshold then performing subsequent programming of the plurality of blocks using a second set of programming parameters.

13. The method of claim 12 wherein the aggregated number is an average of the plurality of blocks.

14. The method of claim 12 wherein the aggregated number is a number of blocks of the plurality of blocks that individually have numbers of marginal memory cells that exceed a predetermined number.

15. The method of claim 12 further comprising performing high resolution read operations on the plurality of blocks to identify distributions of cells and wherein the second set of programming parameters are selected according to the identified distributions of cells.

16. The method of claim 15 further comprising modifying read parameters according to the identified distributions of cells.

17. The method of claim 12 wherein a read operation on an individual block to determine the number of marginal memory cells in the block is performed in a polling cycle that is triggered by a write erase cycle count of the block reaching a predetermined count.

18. A nonvolatile block-erasable memory system comprising:
a plurality of blocks of nonvolatile memory cells;
a programming circuit that is configured to program memory cells to two or more predetermined threshold voltage ranges that correspond to two or more logic states;
a reading circuit that is configured to, in a conventional read mode identify cells in threshold voltage ranges assigned to logic states, and in a diagnostic mode identify marginal cells that have threshold voltages in marginal threshold voltage ranges; and
a reconfiguration unit that is configured to reconfigure assignment of the threshold voltage ranges to logic states for the plurality of blocks in response to numbers of marginal cells identified by the reading circuit in the diagnostic mode.

19. The nonvolatile block-erasable memory system of claim 18 further comprising a write-erase cycle counter that individually counts a number of write-erase cycles experienced by each of the plurality of blocks of nonvolatile memory cells, and wherein the diagnostic mode is triggered for an individual block by the number of write-erase cycles experienced by the block reaching a predetermined number.

20. The nonvolatile block-erasable memory system of claim 18 wherein the reconfiguration unit is configured to individually reconfigure assignment of the threshold voltage ranges to logic states on a block-by-block basis.

21. The nonvolatile block-erasable memory system of claim 18 further comprising an aggregating unit that aggregates numbers of marginal cells of the plurality of blocks to obtain an aggregated metric, and wherein the reconfiguration unit is configured to reconfigure the plurality of blocks of nonvolatile memory cells together in response to the aggregated metric reaching a predetermined level.

* * * * *